(12) United States Patent
Takumori

(10) Patent No.: US 7,093,702 B2
(45) Date of Patent: Aug. 22, 2006

(54) ELECTRICALLY OPENING AND CLOSING MECHANISM

(75) Inventor: Toru Takumori, Saitama (JP)

(73) Assignee: Enplas Corporation, Saitama (JP)

( * ) Notice: Subject to any disclaimer, the term of this patent is extended or adjusted under 35 U.S.C. 154(b) by 46 days.

(21) Appl. No.: 10/701,867

(22) Filed: Nov. 4, 2003

(65) Prior Publication Data

US 2004/0090754 A1    May 13, 2004

(30) Foreign Application Priority Data

Nov. 6, 2002   (JP) ............................ P2002-322195
Jun. 17, 2003  (JP) ............................ P2003-171630

(51) Int. Cl.
*F16D 67/02*  (2006.01)

(52) U.S. Cl. .............................. 192/16; 192/34; 192/96

(58) Field of Classification Search .................. 16/235, 16/241, 242, 297, 321, 323, 326, 328, 337, 16/342; 192/14, 16, 18 R, 34, 96; 379/433.13; 455/90.3, 575.3

See application file for complete search history.

(56) References Cited

U.S. PATENT DOCUMENTS 5,923,751 A * 7/1999 Ohtsuka et al. ........ 379/433.13
6,459,887 B1* 10/2002 Okuda ........................ 455/90.1
6,628,974 B1* 9/2003 Lim .......................... 455/575.3
6,785,935 B1* 9/2004 Ahn et al. .................... 16/221
6,876,872 B1* 4/2005 Ko ............................... 455/572
6,885,849 B1* 4/2005 Kim et al. .................. 455/90.3
2001/0036265 A1* 11/2001 Oh ........................ 379/433.01
2002/0025787 A1* 2/2002 Lee ............................... 455/90
2002/0160727 A1* 10/2002 Won ............................. 455/90
2003/0040330 A1* 2/2003 Kim et al. .................. 455/550
2003/0227564 A1* 12/2003 Lim ............................. 348/375

FOREIGN PATENT DOCUMENTS

JP        2002-314654        10/2002

* cited by examiner

*Primary Examiner*—Saul Rodriguez
(74) *Attorney, Agent, or Firm*—Bachman & LaPointe, P.C.

(57) ABSTRACT

If only an operating button 14 is pushed, an electrically opening and closing mechanism 1 disengages a first clutch K1 while engaging a second clutch K2 to operate an electrically driving means 2 to automatically open or close a second member (e.g., a liquid crystal display panel) 4 which is rotatable with respect to a first member (e.g., a body having a plurality of keys) 3. If the operating button 14 is pushed, the second member 4 automatically rotates to an optional angular position with respect to the first member 3, and if the operating button 14 is released (if the operating button 14 is returned to the original angular position by the spring force of a second spring 23), the first clutch K1 is engaged at the optional angular position to hold the attitude of the second member 4.

6 Claims, 13 Drawing Sheets

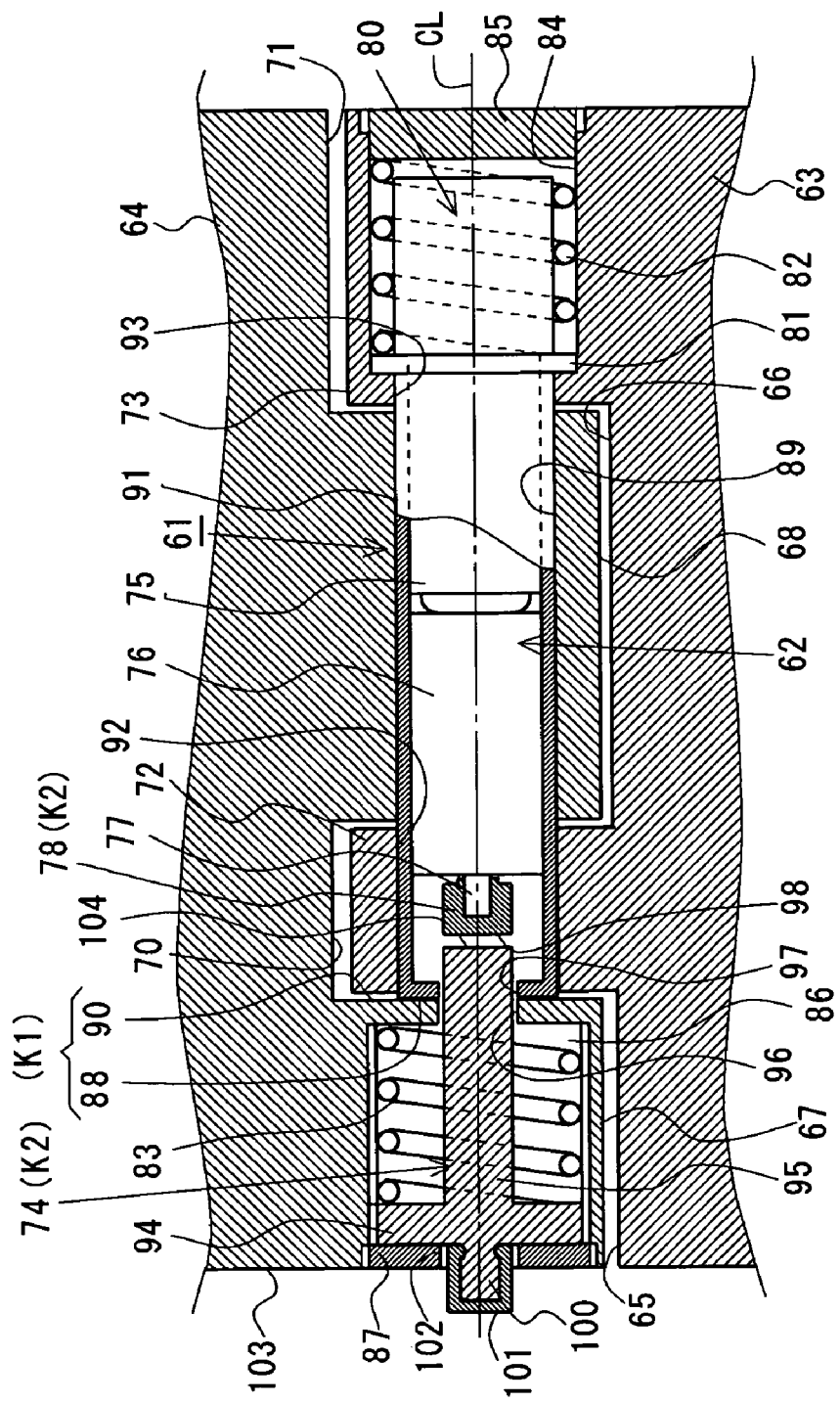

ELECTRICALLY OPENING AND CLOSING MECHANISM

BACKGROUND OF THE INVENTION

1. Field of the Invention

The present invention generally relates to an electrically opening and closing mechanism. More specifically, the invention relates to an electrically opening and closing mechanism for opening and closing a foldable image display part of a portable telephone, a portable information terminal or the like with respect to its body, or for opening and closing a lid member or the like which is mounted on an opening portion of a body.

2. Description of the Prior Art

There is known a portable telephone or portable information terminal which has a body serving as an operating part on which a plurality of keys are mounted, and an image display part having a liquid crystal display panel mounted on the end portion of the body so as to be capable of being open and closed, the liquid crystal display panel of the image display part being foldable so as to be piled on the body to be stored. When such a portable telephone or portable information terminal is used, a user generally holds the body in his one hand and opens the image display part with his other hand, so that it is not always easy to handle the portable telephone or portable information terminal with his one hand. Therefore, there has been developed a technique for allowing a user to handle a portable telephone with his one hand so that the folded portable telephone can be open by the force of a spring if only an operating button (an unlocking button) is pushed (see, e.g., Japanese Patent Laid-Open No. 2002-314654).

However, since such a portable telephone is designed to open an image display part, which is folded on a body, by spring force, the body and image display part are designed to be open to a predetermined angular position at a stroke, so that the opening angle between the body and image display part can not be optionally adjusted. Therefore, when a user handles a portable telephone with his one hand, it is desired to provide a technique for allowing an image display part to be rotated to an optional opening angle to be held.

SUMMARY OF THE INVENTION

It is therefore an object of the present invention to meet such a demand and to provide a technique for improving the operation performance of a portable telephone, a portable information terminal or the like with user's one hand.

It is another object of the present invention to provide a technique for improving the operation performance of two members, which are relatively rotatable, with user's one hand.

In order to accomplish the aforementioned and other objects, according to one aspect of the present invention, an electrically opening and closing mechanism comprises: electrically driving means for electrically rotating a first member which is rotatably mounted on a second member; a first clutch which is engaged for allowing the first and second members to frictionally contact each other when the first member is manually rotated; a second clutch which is engaged for allowing the first and second members to frictionally contact each other when the first member is rotated by the electrically driving means; and an operating part for disengaging the first clutch and engaging the second clutch when the operating part is pushed.

In this electrically opening and closing mechanism, each of the first and second clutches is preferably a friction clutch. The first clutch, the second clutch, the operating part and the electrically driving means are preferably arranged concentrically with a rotation center of the first and second members. The operating part preferably serves as a rotation supporting portion for rotatably supporting thereon the first and second members. The first clutch preferably comprises a pair of friction members, one of which is pressed against the other of the friction members by a spring, and the pair of friction members preferably have a recess and a protrusion, respectively, the recess engaging the protrusion when the first member relatively rotates by a predetermined angle.

According to another aspect of the present invention, an electrically opening and closing mechanism comprises: electrically driving means for electrically rotating a first member which is rotatably mounted on a second member; and a friction clutch which is engaged for allowing the first and second members to frictionally contact each other and which is rotated by the electrically driving means, when the first member is rotated by the electrically driving means.

In this electrically opening and closing mechanism, the friction clutch and the electrically driving means are preferably arranged concentrically with a rotation center of the first and second members.

The electrically opening and closing mechanism may further comprise a sensor for detecting that the first member rotates to a predetermined angle, and the electrically driving means may be rotated in a reverse direction in response to a detection signal of the sensor.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 9 is a sectional view of the second preferred embodiment of an electrically opening and closing mechanism according to the present invention when the mechanism is manually operated;

DESCRIPTION OF THE PREFERRED EMBODIMENTS

Referring now to the accompanying drawings, the preferred embodiments of an electrically opening and closing mechanism according to the present invention will be described below in detail.

First Preferred Embodiment

Figure 1:
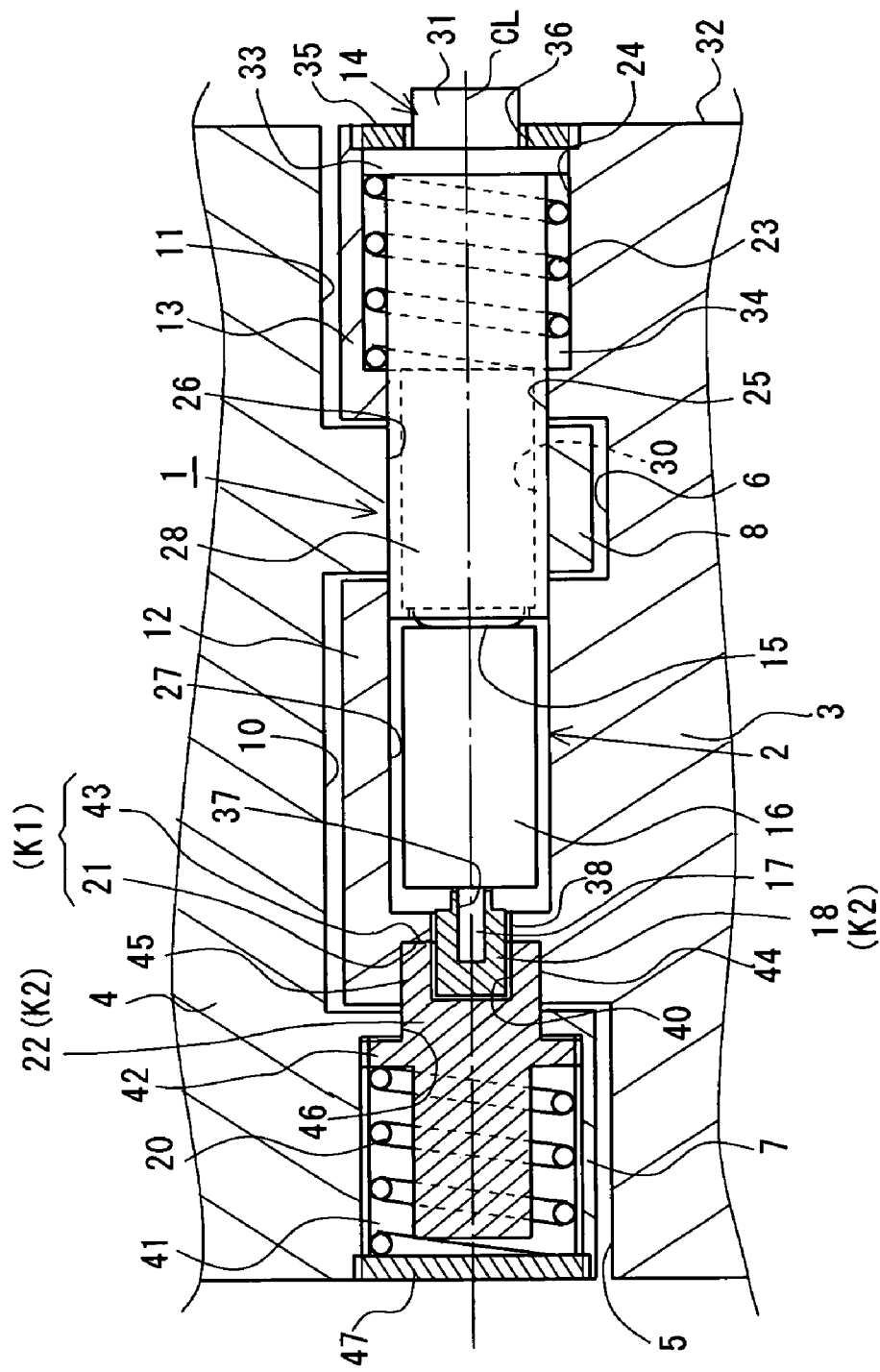
FIG. 1 is a sectional view of the first preferred embodiment of an electrically opening and closing mechanism according to the present invention when the mechanism is manually operated.
Figure 2:
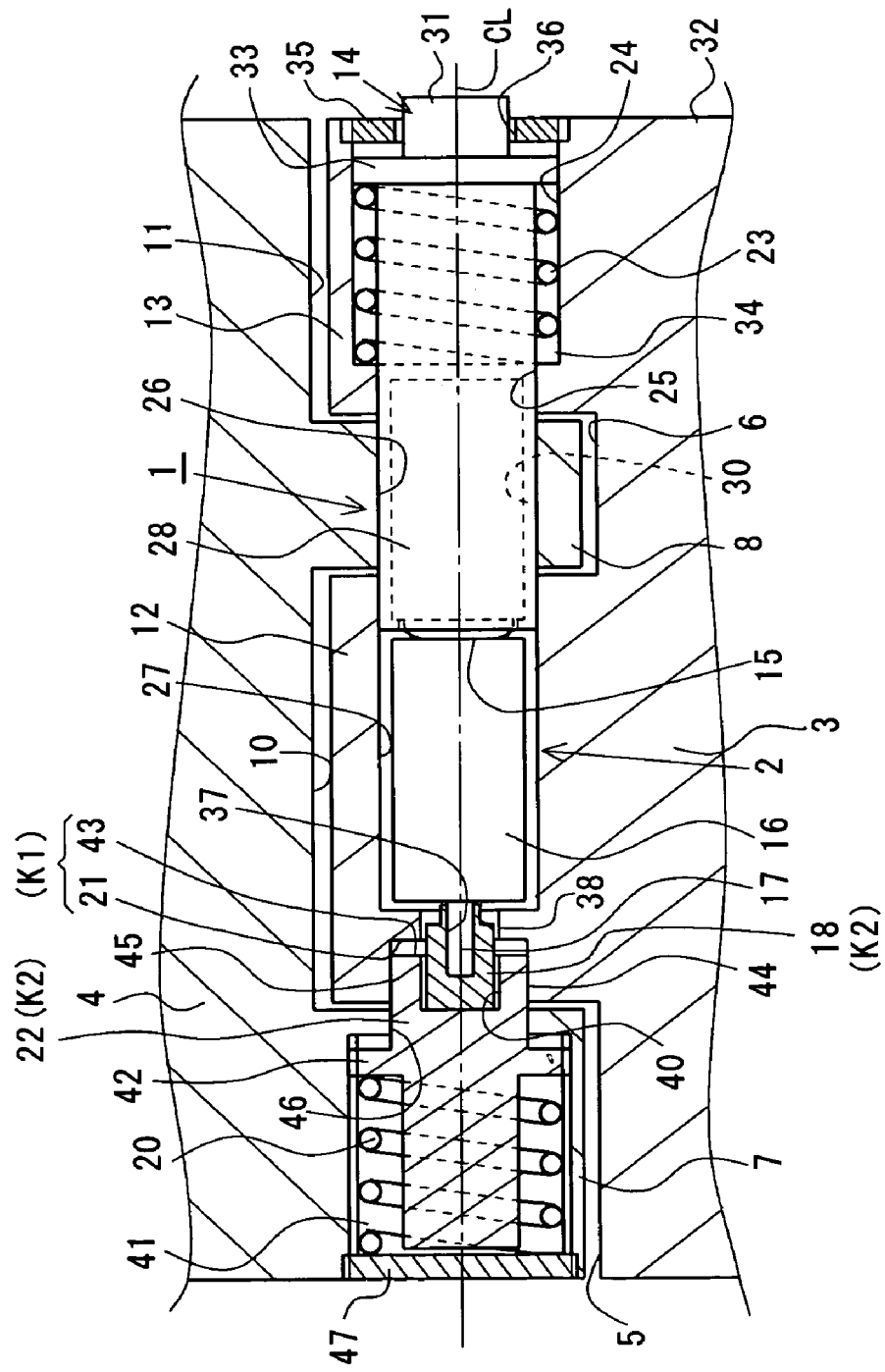
FIG. 2 is a sectional view of the first preferred embodiment of an electrically opening and closing mechanism according to the present invention when the mechanism is electrically operated.

FIGS. 1 and 2 show an electrically opening and closing mechanism 1 in this preferred embodiment. FIG. 1 shows the electrically opening and closing mechanism 1 during a manually opening or closing operation, and FIG. 2 shows the electrically opening and closing mechanism 1 during an electrically opening or closing operation using an electrically driving means 2.

As shown in FIG. 1, the end portions of a first member 3 and a second member 4 are combined with each other so as to be relatively rotatable. That is, recessed portions 5 and 6 formed in the end portion of the first member 3 engage protruding portions 7 and 8 formed on the end portion of the second member 4, via a predetermined gap, respectively, and recessed portions 10 and 11 formed in the end portion of the second member 4 engage protruding portions 12 and 13 formed on the end portion of the first member 3, via a predetermined gap, respectively. The electrically opening and closing mechanism 1 is arranged so as to be laid across the protruding portions 7, 12, 8 and 13 of the first and second members 3 and 4.

The electrically opening and closing mechanism 1 comprises: an operating button 14 serving as an operating part; a motor 15 serving as a driving source which is operated in response to the operation of the operating button 14; a reducer 16 for decelerating and outputting the rotation of the motor 15; a friction member 18 which is fixed to an output shaft 17 of the reducer 16; a friction member 22 which frictionally contacts the side face 21 of the first member 3 by the spring force of a first spring 20 when the operating button 14 is not pushed; and a second spring 23 for causing a spring force to act on the operating button 14 against the pushing operation of the operating button 14. The operating button 14, the motor 15, the reducer 16, the friction member 18, the friction member 22, the first spring 20 and the second spring 23 are arranged concentrically with the rotation center CL of the first and second members 3 and 4. The motor 15 and the reducer 16 are associated with each other for forming the electrically driving means 2 for electrically opening and closing the second member 4.

The operating button 14 is slidably housed in holes 24–27 formed in the first and second members 3 and 4. The operating button 14 has a cylindrical portion 28, the outer peripheral surface of which slidably contacts the holes 25 and 27 of the first member 3 and the hole 26 of the second member 4, so that the cylindrical portion 28 of the operating button 14 serves as a shaft portion (a rotation supporting portion) for supporting thereon the second member 4 rotatably with respect to the first member 3. The cylindrical portion 28 of the operating button 14 houses therein the motor 15 on the side of its inner peripheral surface (in a hole 30), and the outer casing (not shown) of the motor 15 is caulked to be fixed thereto. The operating button 14 has an operating protrusion 31 which protrudes outwardly from the outside face 32 of the first member 3, and a flange portion 33 which has a larger diameter than that of the cylindrical portion 28 and operating protrusion 31 and which is housed in the hole 24 of the first member 3 so as to be slidable and so as not to be relatively rotatable. The flange portion 33 of the operating button 14 is always biased to the right in FIG. 1 by means of the second spring 23 which is housed in the hole 24 of the first member 3 and in a space 34 on the outer peripheral side of the cylindrical portion 28. A lid member 35 is screwed on the opening portion of the hole 24 of the first member 3 to stop the flange portion 33 of the operating button 14. The operating protrusion 31 of the operating button 14 passes through the hole 36 of the lid member 35 to protrude to the outside.

The reducer 16 is mounted on the motor 15, which is fixed to the cylindrical portion 28 of the operating button 14, so as to be slidable with the motor 15. The reducer 16 has a plurality of gears, such as planetary gears, which are housed in its casing (not shown) and which engage each other, so as to sufficiently decelerate and output the rotation of the motor 15 from the output shaft 17.

The friction member 18 has a cylindrical shape with bottom, and has a hole 37 into which the output shaft 17 of the reducer 16 is fitted, so that the friction member 18 is fixed to and rotatable with the output shaft 17. The outer peripheral surface of the friction member 18 engages the hole 38 of the first member 3 via a gap, and the tip portion of the friction member 18 engages the tip recessed portion 40 of the friction member 22 via a gap.

The friction member 22 is slidably housed in a hole 41 which is formed in the protruding portion 7 of the second member 4. The friction member 22 has a large-diameter flange portion 42 which is biased to the right in FIG. 1 by the spring force of the first spring 20 housed in the hole 41 of the second member 4. The friction member 22 also has an annular tip face 43 which frictionally contacts the side face 21 of the hole 43 of the first member 3. The tip face 43 of the friction member 22 is associated with the side face 21 of the hole 44 of the first member 3 for forming a first clutch (friction clutch) K1 for connecting the first member 3 to the second member 4.

The substantially cylindrical tip portion 45 of the friction member 22 engages the hole 46 of the second member 4 and the hole 44 of the first member 3, and serves as a shaft portion (a rotation supporting portion) for supporting thereon the second member 4 so as to allow the second member 4 to rotate with respect to the first member 3. The flange portion 42 of the friction member 22 is mated with the inner peripheral surface of the hole 41 of the second member 4 (e.g., serration fitting, fitting of a key into a key way) so as to be slidable with respect to the second member 4 and so as not to be relatively rotatable with respect to the second member 4 (so as to be rotatable with the second member 4). A lid member 47 is screwed on the opening portion of the hole 41 of the second member 4 to serve as a spring bearing for bearing the first spring 20.

In the electrically opening and closing mechanism 1 with this construction, the tip face 43 of the friction member 22 is pushed onto the side face 21 of the first member 3 by means of the first spring 20. Therefore, when the second member 4 is manually open from a state (a state shown by A in FIG. 3) that the second member 4 is folded so as to be piled on the first member 3, a frictional force acts on the contact portion of the tip face 43 of the friction member 22 with the side face 21 of the first member 3, so that the frictional force can stop the second member 4 at an optional angular position (an angular position B in FIG. 3). The second member 4 can be open to the maximum opening angular position (a position C in FIG. 3) against the frictional force acting on the contact portion of the tip face 43 of the friction member 22 with the side face 21 of the first member 3. If the second member 4 positioned at the position B or C is rotated counterclockwise in FIG. 3 against the frictional force acting on the contact portion of the tip face 43 of the friction member 22 with the side face 21 of the first member 3, the second member 4 can be folded so as to be piled on the first member 3.

FIG. 2 shows a state that the second member 4 is electrically operated. That is, if the operating button 14 is thrust to the left from the state shown in FIG. 1, the friction member 18 is pushed onto the friction member 22 as shown in FIG. 2, so that the friction member 22 is thrust to the left in the figure against the spring force of the first spring 20 to release the friction contact of the friction member 22 with the first member 3 (to disengage the first clutch K1). The friction member 18 is associated with the friction member 22 for forming a second clutch K2 for connecting the electrically driving means 2 to the second member 4.

If the amount of movement (thrust amount) of the operating button 14 reaches a predetermined amount, the operating button 14 causes a switch (not shown) to be turned ON to energize and rotate the motor 15, the rotation of which is reduced by the reducer 16 to be transmitted to the friction member 18 via the output shaft 17. Then, the rotation is transmitted from the friction member 18 to the friction member 22, so that the second member 4 rotates with the friction member 22 (the second member 4 is open). Then, if the pushing force to the operating button 14 is released, the operating button 14, motor 15, reducer 16 and friction member 18 are integrated with each other to return to the original position (the position shown in FIG. 1) by the spring force of the second spring 23 to disengage the second clutch K2 to cause the tip face 43 of the friction member 22 to contact the side face 21 of the first member by the spring force of the first spring 20 (to engage the first clutch K1), so that the second member 4 is held at the angular position (e.g., the angular position B in FIG. 3). If the operating button 14 returns toward the original position by a predetermined amount, the switch (not shown) is turned OFF, so that the rotation of the motor 15 is stopped.

If the operating button 14 is further thrust by a predetermined amount from the state that the second member 4 is open by a predetermined angle, the friction member 18 contacts the friction member 22 (the second clutch K2 is engaged) to release the friction contact of the friction member 22 with the first member 3 (to disengage the first clutch K1) to rotate the motor 15. Then, the rotation of the motor 15 is transmitted to the friction member 18 via the reducer 16, and the rotation of the friction member 18 is transmitted to the friction member 22, so that the second member 4, together with the friction member 22, rotates to the maximum open position (the position C in FIG. 3). Then, when the second member 4 rotates to the maximum open position, energization to the motor 15 is interrupted, so that the rotation of the motor 15 is stopped.

If the operating button 14 is further thrust by a predetermined amount from the state that the second member 4 rotates to the maximum open position, the friction member 18 contacts the friction member 22 (the second clutch K2 is engaged) to release the contact of the friction member 22 with the first member 3 (to disengage the first clutch K1) to rotate the motor 15 in a reverse direction. Then, the rotation of the motor 15 is transmitted to the friction member 18 while being reduced by the reducer 16, to rotate the second member 4 in a closed direction. Then, if the second member 4 is folded so as to be piled on the first member 3, energization to the motor 15 is interrupted, so that the rotation of the motor 15 is stopped.

Furthermore, the first member 3 is provided with a first sensor 48 for detecting a position (position A in FIG. 3) at which the second member 4 is folded on the first member 3, and a second sensor 50 for detecting the maximum open position (position C in FIG. 3) at which the second member 4 rotates to the maximum. Detection signals from the first and second sensors 48 and 50 are inputted to a control means (not shown) (e.g., a micro computer) for controlling the rotation of the motor 15.

With this construction, in the electrically opening and closing mechanism 1 in this preferred embodiment, when the second member 4 is manually open, the tip face 43 of the friction member 22 frictionally contacts the side face 21 of the first member 21, so that the second member 4 is held at an optional angular position by the frictional force caused on the contact portion of the tip face 43 of the friction member 22 with the side face 21 of the first member 3. At this time, the second clutch K2 is disengaged, and no load is applied on the electrically driving means 2, so that the electrically driving means 2 is not damaged by the manual operation. In addition, during this manual operation, the electrically driving means 2 does not follow the rotation of the second member 4, so that vibrations and abnormal noises are not produced.

In the electrically opening and closing mechanism 1 in this preferred embodiment, if only the operating button 14 is pushed, it is possible to disengage the first clutch K1 while engaging the second clutch K2, to operate the electrically driving means 2 to automatically open and close the second member 4. In addition, the electrically opening and closing mechanism 1 in this preferred embodiment can automatically rotate the second member 4 to an optional angular position by operating the operating button 14, to hold the attitude of the second member 4 at the optional angular position. As a result, according to the electrically opening and closing mechanism 1 in this preferred embodiment, a user can very easily open and close the second member 4 by his one hand.

The electrically opening and closing mechanism 1 in this preferred embodiment can adjust the frictional force (contact pressure) of the second clutch K2 in accordance with the operated amount of the operating button 14 since it is designed to engage the second clutch K2 by pushing the operating button 14. Therefore, according to this preferred embodiment, even if the spring force of the first spring 20 for biasing the friction member 22 being one of components of the second clutch K2 is weakened, the deterioration of the spring force of the first spring 20 can be compensated by increasing the operated amount of the operating button 14, so that it is possible to ensure a stable operation for a long period of time. In addition, in this preferred embodiment, it is possible to produce a desired frictional force on the friction contact surface of the second clutch K2 by increasing or decreasing the pushing force to the operating button 14, e.g., by increasing the thrust amount of the operating button 14 to push the left end portion of the friction member 22 against the lid member 47 if the spring force of the first spring 20 is weakened so that the frictional force of the second clutch K2 falls short.

In the electrically opening and closing mechanism 1 in this preferred embodiment, the second clutch K2 is a friction clutch. Therefore, if a user manually operates the second member 4 while the second member 4 is electrically open or closed, the second clutch K2 causes a slip, so that it is possible to prevent overload from being applied to the electrically driving means 2.

In the electrically opening and closing mechanism 1 in this preferred embodiment, the first member 3 and the second member 4 are concentrically with the rotation center, and a part thereof serves as a shaft supporting portion for allowing the relative rotation of the first member 3 and second member 4. Therefore, it is possible to miniaturize and lighten a machine to be mounted (e.g., a portable telephone or a portable information terminal).

Figure 3:
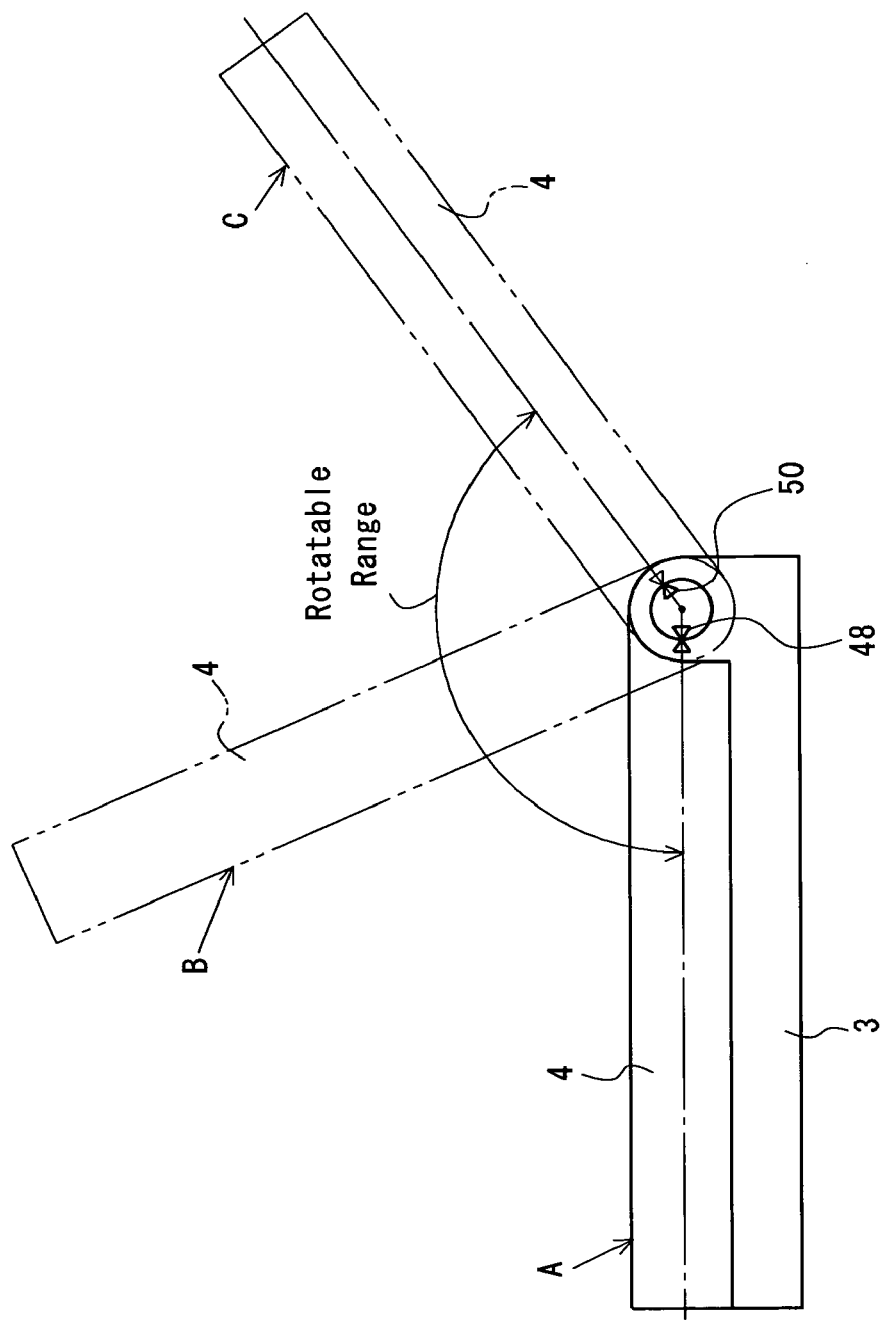
FIG. 3 is an illustration for explaining the rotating state of first and second members.
Figure 4:
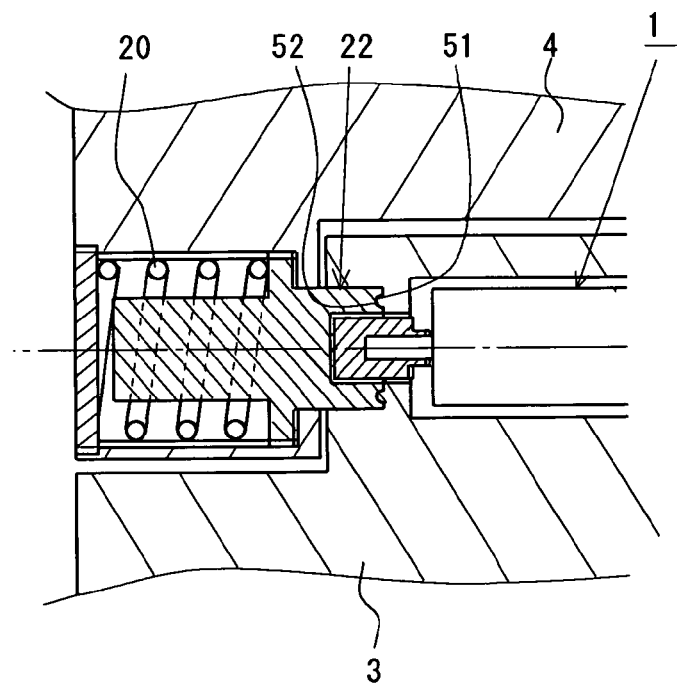
FIG. 4 is a sectional view of a part of an applied example of the first preferred embodiment of an electrically opening and closing mechanism according to the present invention during a manual operation.
Figure 6A:
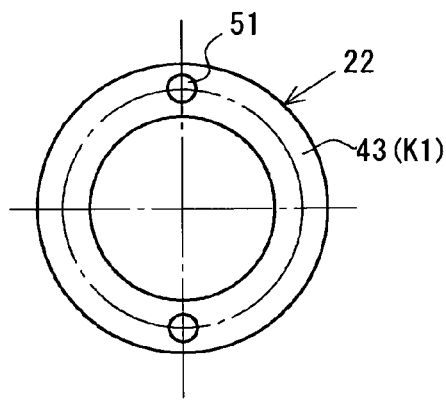
FIGS. 6A and 6B are illustrations showing a friction contact surface between a friction member and a first member in the applied example of the first preferred embodiment.
Figure 6B:
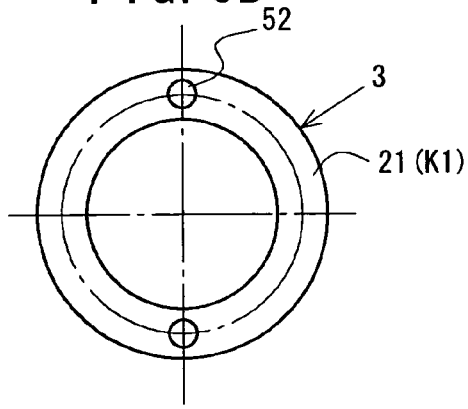

FIGS. 4, 6A and 6B show an applied example of the electrically opening and closing mechanism 1 in this preferred embodiment. In this applied example, a pair of substantially semi-spherical recesses 51 are formed in the tip face 43 of the friction member 22 (see FIG. 6A), and a pair of substantially semi-spherical protrusions 52 engageable with the recesses 51 are formed on the side face 21 of the first member 3 facing the tip face 43 of the friction member 22 (see FIG. 6B). In this applied example, the recesses 51 of the friction member 22 engage the protrusions 52 of the first member 3 due to the spring force of the first spring 20 in a state (state A in FIG. 3) that the second member 4 is folded so as to be piled on the first member 3 and in a state that the second member 4 is open to a predetermined angular position.

As a result, according to this applied example, the user can have a click feeling when manually operating the second member 4, so that the user can have a sense of security on the manual operation. Moreover, in this applied example, the attitude of the second member 4 is held by the frictional force of the first clutch K1 and by the engagement of the recesses 51 with the protrusions 52, so that the attitude holding force to the second member 4 can be higher than that when the attitude of the second member 4 is held by only the frictional force of the first clutch K1.

Furthermore, if the second member 4 is manually rotated in the state that the recesses 51 of the friction member 22 engage the protrusions 52 of the first member 3, the friction member 22 is moved against the first member 20 by the protrusions 52 of the first member 1, so that the recesses 51 of the friction member 22 disengage from the protrusions 52 of the first member 3.

Figure 5:
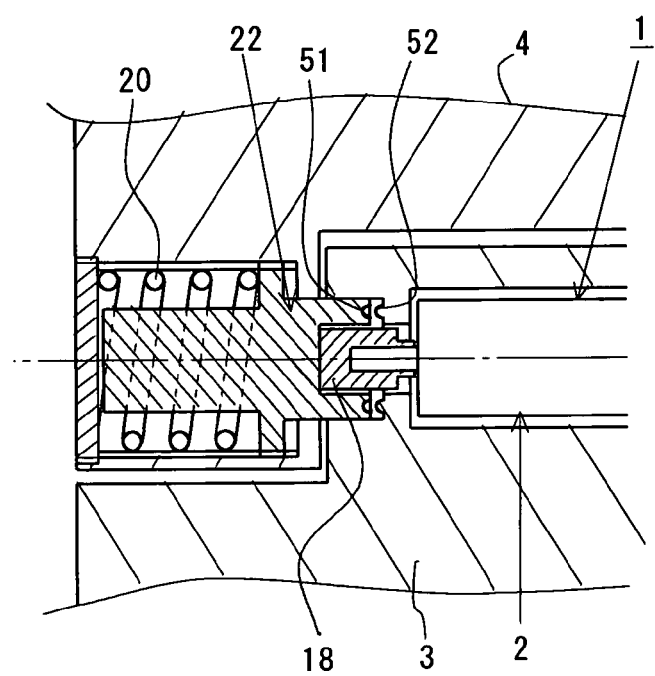
FIG. 5 is a sectional view of a part of an applied example of the first preferred embodiment of an electrically opening and closing mechanism according to the present invention during an electrical operation.

On the other hand, when the second member 4 is rotated by the electrically driving means 2 comprising the motor and reducer as shown in FIG. 5, the tip face 43 of the friction member 22 leaves the side face 21 of the first member 3 (the first clutch K1 is disengaged) by pushing the operating button (see FIG. 2), so that the recesses 51 of the friction member 22 do not engage the protrusions 52 of the first member 3.

Figure 7A:
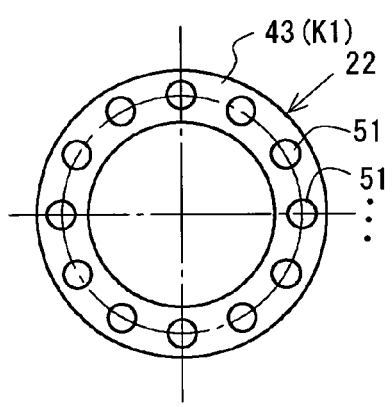
FIGS. 7A and 7B are illustrations showing a friction contact surface between a friction member and a first member in a first modified example of the applied example.
Figure 7B:
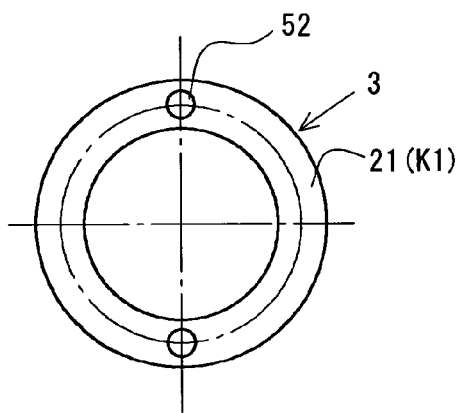

FIGS. 7A and 7B show a first modified example of the applied example shown in FIGS. 6A and 6B. In this modified example, a plurality of recesses 51 are formed in the friction member 22 at regular intervals in circumferential directions (see FIG. 7A), and a pair of the recesses 51 are designed to simultaneously engage a pair of protrusions 52 of the first member 3 shown in FIG. 7B. Thus, a plurality of angular positions capable of positioning and holding the second member 4 are set while the second member 4 is manually rotated to the maximum open position, so that the opening angle of the second member 4 can be finely adjusted.

Figure 8A:
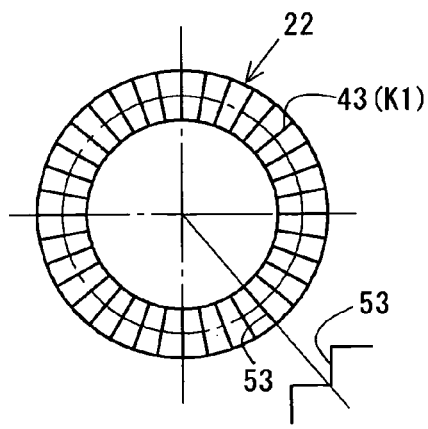
FIGS. 8A and 8B are illustrations showing a friction contact surface between a friction member and a first member in a second modified example of the applied example.
Figure 8B:
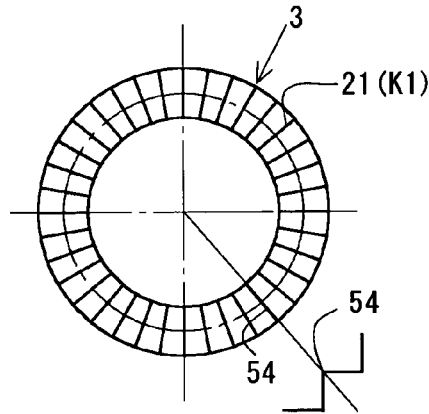

FIGS. 8A and 8B show a second modified example of the applied example shown in FIGS. 6A and 6B. In this modified example, a plurality of recesses 53 having a substantially triangular cross section and extending in radial directions are formed in the tip face 43 of the friction member 22 (see FIG. 8A), and a plurality of protrusions 54 having a substantially triangular cross section and extending in radial directions are formed on the side face 21 of the first member 3 so as to face the recesses 53 of the tip face 43 of the friction member 22 (see FIG. 8B).

Second Preferred Embodiment

Figure 10:
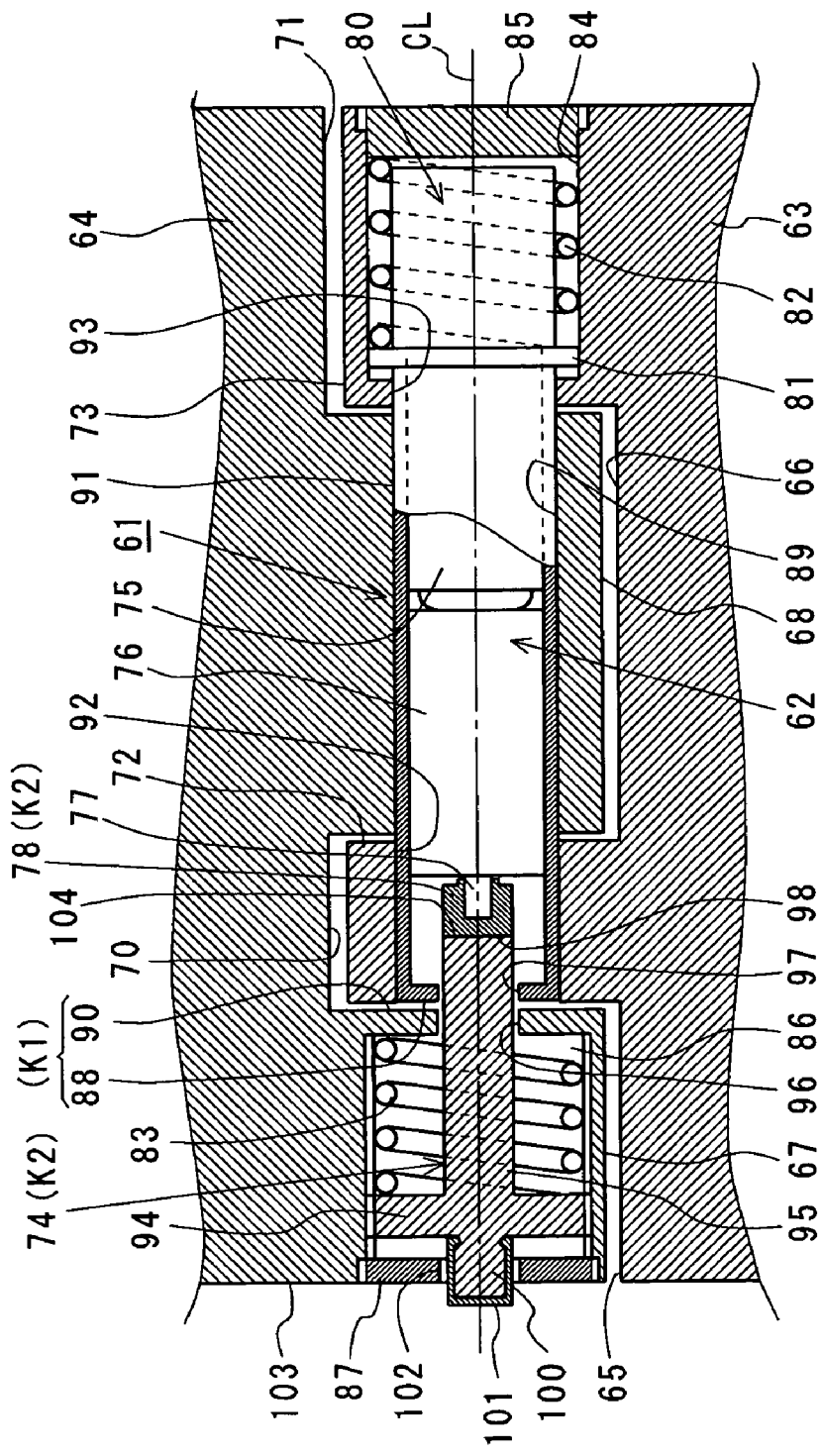
FIG. 10 is a sectional view of the second preferred embodiment of an electrically opening and closing mechanism according to the present invention when the mechanism is electrically operated.

FIGS. 9 and 10 show the second preferred embodiment of an electrically opening and closing mechanism 61 according to the present invention. FIG. 9 shows the electrically opening and closing mechanism 61 during a manually opening or closing operation, and FIG. 10 shows the electrically opening and closing mechanism 61 during an electrically opening or closing operation using an electrically driving means 62.

As shown in FIG. 9, the end portions of a first member 63 and second member 64 are combined with each other so as to be relatively rotatable. That is, recessed portions 65 and 66 formed in the end portion of the first member 63 engage protruding portions 67 and 68 formed on the end portion of the second member 64, via a predetermined gap, respectively, and recessed portions 70 and 71 formed in the end portion of the second member 64 engage protruding portions 72 and 73 formed on the end portion of the first member 63, via a predetermined gap, respectively. The electrically opening and closing mechanism 61 is arranged so as to be laid across the protruding portions 67, 72, 68 and 73 of the first and second members 63 and 64.

The electrically opening and closing mechanism 61 comprises: an operating button 74 serving as an operating part;

a motor 75 serving as a driving source which is operated in response to the operation of the operating button 74; a reducer 76 for decelerating and outputting the rotation of the motor 75; a friction member 78 which is fixed to an output shaft 77 of the reducer 76; an electrically driving means holding body 80 for housing therein and holding an electrically driving means 62 comprising the motor 75 and reducer 76; a second spring 82 for biasing the flange portion 81 of the electrically driving means holding body 80 to the left in FIG. 9; and a first spring 83 for always biasing the operating button 74 to the left in FIG. 9. A lid member 85 serving as a spring bearing for bearing the second spring 82 is screwed on the open end of a hole 84 of the first member 63, and a lid member 87 for stopping the operating button 74 biased by the first spring 83 is screwed on the open end of a hole 86 of the second member 64. The tip face 88 of the electrically driving means holding body (first clutch) 80 is designed to be pushed onto the side face 90 of the second member 64 by the spring force of the second spring 82, to frictionally contact the side face 90 of the second member 64. The tip face 88 of the electrically driving means holding body 80 is associated with the side face 90 of the second member 64 for forming a first clutch K1 for producing a frictional force when the second member 64 and first member 63 relatively rotate. Furthermore, the operating button 74, the motor 75, the reducer 76, the electrically driving means holding body 80, the friction member 78, the first spring 83 and the second spring 82 are arranged concentrically with the rotation center CL of the first and second members 63 and 64.

The electrically driving means holding body 80 has a cylindrical portion 91 which houses therein the motor 75 and reducer 76 and which is slidably fitted into the holes 92, 89, 93 and 84 of the first and second members 63 and 64, and also serves as a shaft portion (a rotation supporting portion) for allowing the relative rotation of the first and second members 63 and 64. The substantially disk-shaped flange portion 81 of the electrically driving means holding body 80 is mated with the inner peripheral surface of the hole 84 (e.g., serration fitting, fitting of a key into a key way) so as to be slidable and so as not to be rotatable.

The substantially disk-shaped flange portion 94 of the operating button 74 is mated with the inner peripheral surface of the hole 86 of the second member 64 (e.g., serration fitting, fitting of a key into a key way) so as to be slidable and so as not to be rotatable. The shaft portion 95 of the operating button 74 passes through the hole 96 of the second member 64 and the tip hole 97 of the electrically driving means holding body 80, so that its tip portion enters the electrically driving means holding body 80 to face the tip face 98 of the friction member 78 via a slight gap.

The operating button 74 has an operating protrusion 100 which protrudes on the opposite side to the shaft portion 95, and has a cap 101 which is mounted on the operating protrusion 100 so as to be relatively rotatable. The operating protrusion 100 and cap 101 of the operating button 74 pass through the hole 102 of the lid member 87, which is screwed on the open end of the hole 86, to protrude outwardly from the side face 103 of the second member 64, so that the user can easily push the operating button 74.

In the electrically opening and closing mechanism 61 with this construction, when the second member 64 is manually open from a state (state A in FIG. 3) that the second member 64 is folded on the first member 63, the tip face 88 of the electrically driving means holding body 80 frictionally contacts the side face 90 of the second member 64 by the spring force of the second spring 82, so that the second member 64 can be stopped at an optional open angular position by a frictional force caused between the second member 64 and the electrically driving means holding body 80.

If the operating button 74 is thrust (pushed) by a predetermined amount in the state of FIG. 9, the tip face 104 of the shaft portion 95 of the operating button 74 pushes the friction member 78 to the right in FIG. 9, and the electrically driving means 62, together with the electrically driving means holding body 80, moves to the right in FIG. 9 to release the friction contact of the tip face 88 of the electrically driving means holding body 80 with the side face 90 the second member 64 (to disengage the first clutch K1) as shown in FIG. 10. Furthermore, the shaft portion 95 of the operating button 74 frictionally engages the friction member 78 during an electrical operation for forming a second clutch K2.

If the operating button 74 is thrust to a state shown in FIG. 10, the operating button 14 causes a switch (not shown) to be turned ON to energize the motor 75, and the rotation of the motor 75 is decelerated by the reducer 76 to be transmitted to the friction member 78 via the output shaft 77. Then, the rotation is transmitted to the second member 64 via the operating button 74 (second clutch 2) frictionally contacting the friction member 78, so that the second member 64 rotates in an opening direction (clockwise) from position A in FIG. 3. Furthermore, if the operating button 74 is returned toward the original position by a predetermined amount, the switch (not shown) is turned OFF, so that the rotation of the motor 75 is stopped.

If the operating button 74 is returned to the original position from a state that the second member 64 is open to a predetermined position (e.g., position B in FIG. 3), the rotation of the motor 75 is stopped, and the tip face 88 of the electrically driving means holding body 80 is pushed onto the side face 90 of the second member 64 by the spring force of the second spring 82 (the first clutch K1 is engaged), so that the second member 64 is held by the frictional force caused between the tip face 88 of the electrically driving means holding body 80 and the side face 90 of the second member 64 (see B in FIG. 3).

If the operating button 74 is pushed to be thrust by a predetermined amount, the tip face 104 of the shaft portion 95 of the operating button 74 is pushed onto the tip face 98 of the friction member 78 (the second clutch K2 is engaged) to release the contact state of the tip face 88 of the electrically driving means holding body 80 with the side face 90 of the second member 64 (to disengage the first clutch K1) to rotate the motor 75. Then, the rotation of the motor 75 is transmitted to the friction member 78 via the reducer 76 to be transmitted from the friction member 78 to the second member 64 via the operating button 74 (second clutch K2), so that the second member 64 rotates to the maximum open position (see position C in FIG. 3). If the second member 64 rotates to the maximum open position, energization to the motor 75 is interrupted, so that the rotation of the motor 75 is stopped.

If the operating button 74 is pushed again to be thrust by a predetermined amount from the state that the second member 64 is held at the maximum open position, the tip face 88 of the electrically driving means holding body 80 leaves the side face 90 of the second member 64, and the motor 75 rotates in a reverse direction. The reverse rotation of the motor 75 is transmitted to the friction member 78 via the reducer 76. Then, the rotation of the friction member 78 is transmitted to the second member 64 via the operating button 74 (second clutch K2), so that the second member 64 rotates in such a direction that the second member 64 is closed from position C to A in FIG. 3 to be folded on the first member 63. If the second member 64 is folded so as to be piled on the first member 63, energization to the motor 75 is interrupted, so that the rotation of the motor 75 is stopped.

As descried above, in this preferred embodiment, the second member 64 can be held at the optional open position during the manual operation by the friction contact of the tip face 88 of the electrically driving means holding body 80, which is arranged on the side of the first member 63, with the side face 90 of the second member 64 (by the first clutch K1). During the manual operation, the second clutch K2 is disengaged, and no load is applied on the electrically driving means 62, so that the electrically driving means 62 is not damaged by the manual operation. In addition, during the manual operation, the electrically driving means 62 does not follow the rotation of the second member 64, so that vibrations and abnormal noises are not produced.

In this preferred embodiment, the pushing operation of the operating button 74 can release the contact of the tip face 88 of the electrically driving means holding body 80 with the side face 90 of the second member 64 (disengage the first clutch K1) and engage the second clutch K2, to rotate the electrically driving means 62 to rotate the second member 64 via the second clutch K2. Therefore, according to this preferred embodiment, the user can easily open and close the second member 64 with his one hand holding the first member 63. In addition, the electrically opening and closing mechanism 61 in this preferred embodiment can automatically rotate the second member 64 to an optional angular position by operating the operating button 74, to hold the attitude of the second member 64 at the optional angular position. As a result, according to the electrically opening and closing mechanism 61 in this preferred embodiment, the user can very easily open and close the second member 64 with his one hand.

The electrically opening and closing mechanism 61 in this preferred embodiment can adjust the frictional force (contact pressure) of the second clutch K2 in accordance with the operated amount of the operating button 74 since it is designed to engage the second clutch K2 by pushing the operating button 74. Therefore, according to this preferred embodiment, even if the spring force of the second spring 82 for biasing the friction member 78 being one of components of the second clutch K2 is weakened, the deterioration of the spring force of the second spring 82 can be compensated by increasing the operated amount of the operating button 74, so that it is possible to ensure a stable operation for a long period of time. In addition, in this preferred embodiment, it is possible to produce a desired frictional force on the friction contact surface of the second clutch K2 by increasing or decreasing the pushing force to the operating button 74, e.g., by increasing the thrust amount of the operating button 74 to push the right end portion of the electrically driving means holding body 80 against the lid member 85 if the spring force of the first spring 82 is weakened so that the frictional force of the second clutch K2 falls short.

In the electrically opening and closing mechanism 61 in this preferred embodiment, the second clutch K2 is a friction clutch. Therefore, even if the user manually operates the second member 64 while the second member 64 is electrically open or closed, the second clutch K2 causes a slip, so that it is possible to prevent overload from being applied to the electrically driving means 62.

The electrically opening and closing mechanism 61 in this preferred embodiment is concentrically with the rotation center of the first member 63 and second member 64, and apart thereof serves as a shaft supporting portion for allowing the relative rotation of the first member 63 and second member 64. Therefore, it is possible to miniaturize and lighten a machine to be mounted (e.g., a portable telephone or a portable information terminal).

Third Preferred Embodiment

Figure 12:
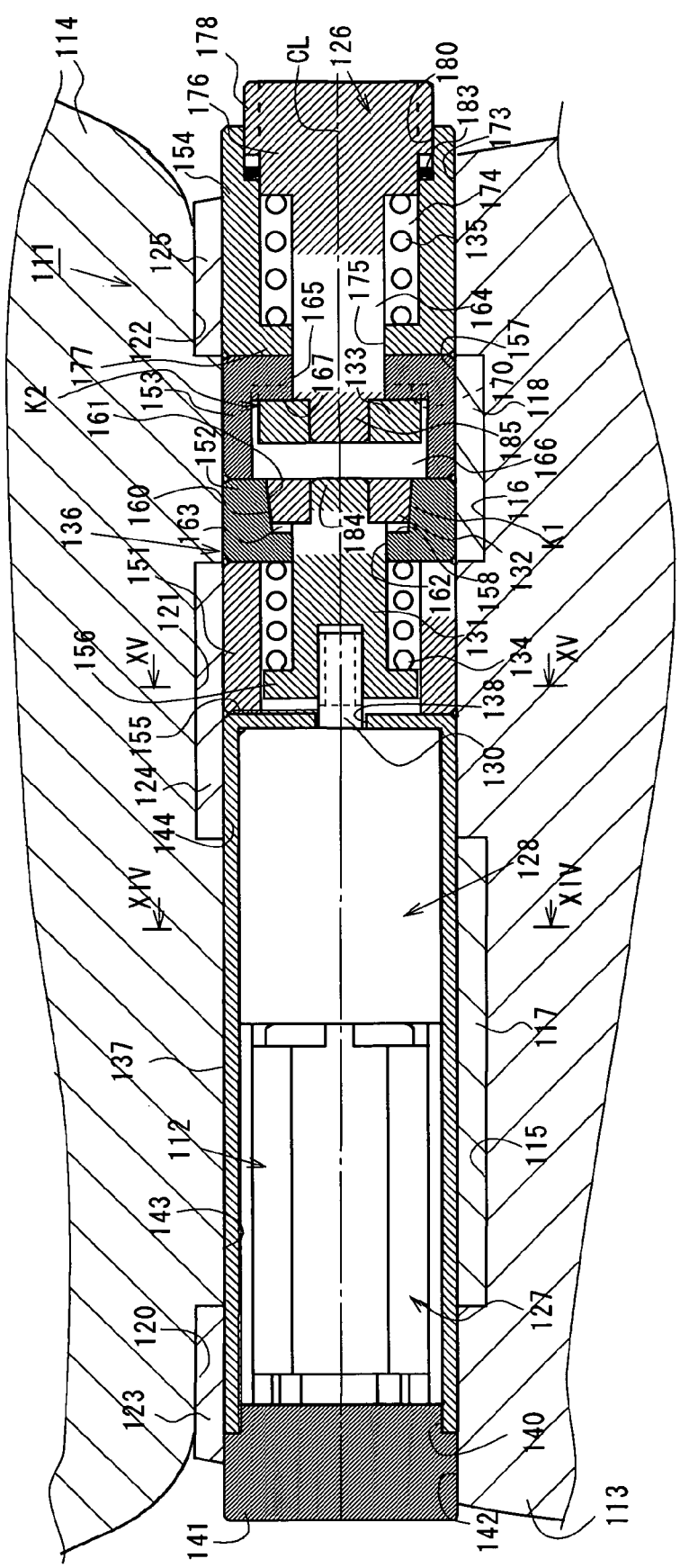
FIG. 12 is a sectional view of the third preferred embodiment of an electrically opening and closing mechanism according to the present invention when the mechanism is manually operated.
Figure 13:
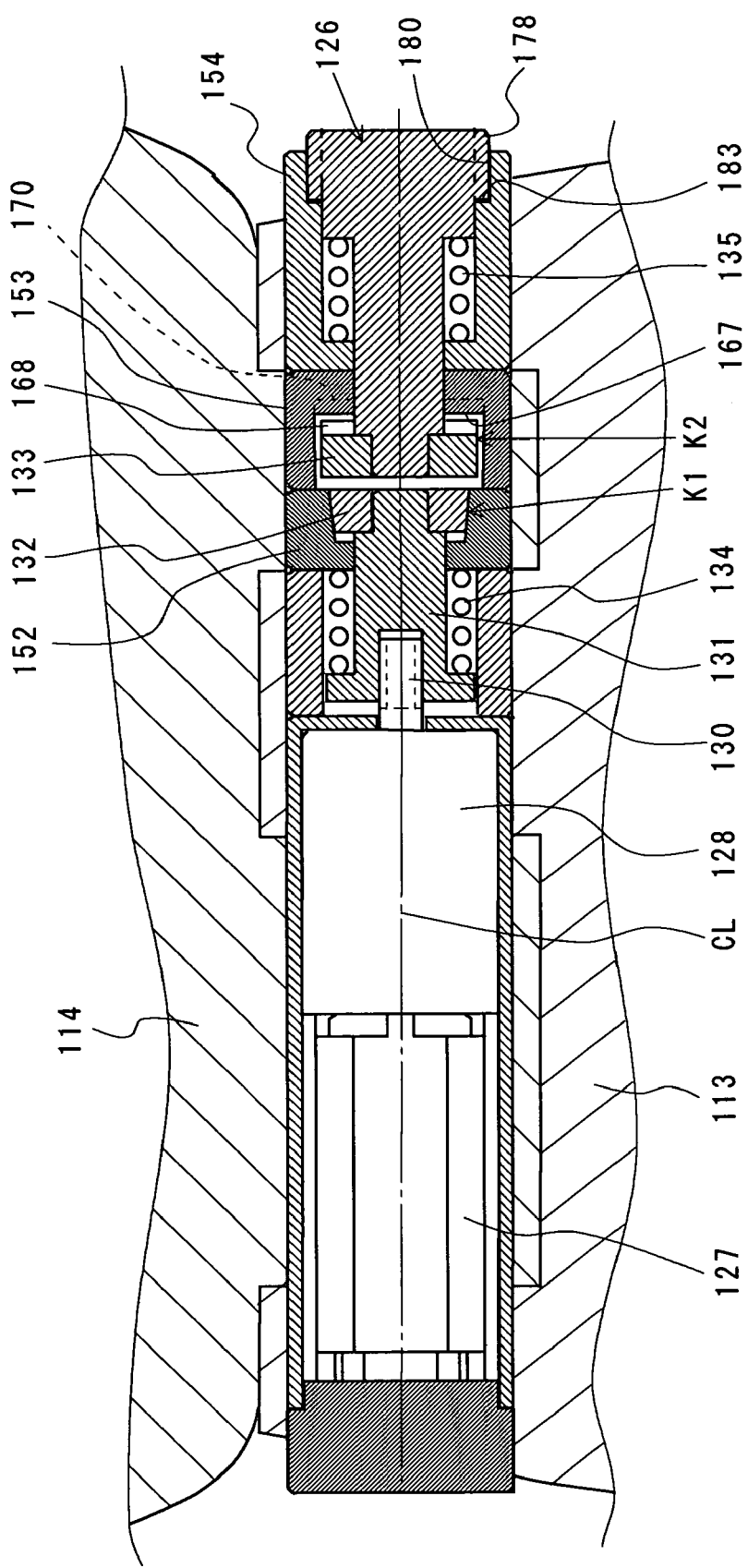
FIG. 13 is a sectional view of the third preferred embodiment of an electrically opening and closing mechanism according to the present invention when the mechanism is electrically operated.

FIGS. 12 and 13 show the third preferred embodiment of an electrically opening and closing mechanism 111 according to the present invention. FIG. 12 shows the electrically opening and closing mechanism 111 during a manually opening or closing operation, and FIG. 13 shows the electrically opening and closing mechanism 111 during an electrically opening or closing operation using an electrically driving means 112.

As shown in FIG. 12, the end portions of a first member 113 and second member 114 are combined with each other so as to be relatively rotatable. That is, recessed portions 115 and 116 formed in the end portion of the first member 113 engage protruding portions 117 and 118 formed on the end portion of the second member 114, via a predetermined gap, respectively, and recessed portions 120, 121 and 122 formed in the end portion of the second member 114 engage protruding portions 123, 124 and 125 formed on the end portion of the first member 113, via a predetermined gap, respectively. The electrically opening and closing mechanism 111 is arranged so as to be laid across the protruding portions 122, 124 and 125 of the first member 113 and the protruding portions 117 and 118 of the second member 114.

The electrically opening and closing mechanism 111 comprises: an operating button 126 serving as an operating part; a motor 127 serving as a driving source which is operated in response to the operation of the operating button 126; a reducer 128 for decelerating and outputting the rotation of the motor 127; a first friction member 132 which is engageable with an output shaft 130 of the reducer 128 via a connecting shaft 131 so as to rotate with the output shaft 130; a second friction member 133 which is fixed to the tip of the operating button 126; a first spring 134 for always biasing the first friction member 132 in a friction contact direction; a second spring 135 for always biasing the second friction member 133 in a friction contact direction and for causing a spring force to act on the operating button 126 against the pushing operation of the operating button 126; and a body block 136 for housing therein the operating button 126, first friction member 132, second friction member 133, first spring 134 and second spring 135. The motor 127, the reducer 128, the connecting shaft 131, the first friction member 132, the first spring 134, the second friction member 133, the second spring 135, the operating button 126 and the body block 136 are arranged concentrically with the rotation center CL of the first and second members 113 and 114.

Figure 14:
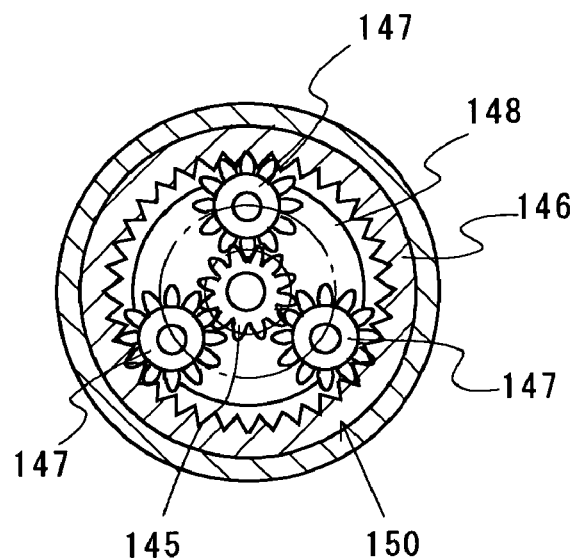
FIG. 14 is a sectional view of the third preferred embodiment of an electrically opening and closing mechanism according to the present invention, which is taken along line XIV—XIV of FIG. 12.

The motor 127 and the reducer 128 are housed in a cylindrical metal casing 137 in series so that the output shaft 130 of the reducer 128 protrudes from an axial hole 138 formed in the tip portion of the cylindrical casing 137. The open end portion 140 of the cylindrical casing 137 is sealed with a lid member 141. The motor 127 and the reducer 128 are associated with the cylindrical casing 137 and lid member 141 for forming an electrically driving means for electrically opening and closing the second member 114. The electrically driving means 112 is housed in holes 142, 143 and 144 formed in the protruding portions 123 and 124 of the first member 113 and the protruding portions 117 of the second member 114, respectively. Both end portions of the outer peripheral surface of the electrically driving means 112 in directions parallel to the rotation center CL are bonded and fixed to the holes 142 and 144 of the first member 113, and a portion of the outer peripheral surface of the electrically driving means 112 engaging the hole 143 of the second member 114 is not bonded and serves as a supporting shaft portion for rotatably supporting thereon the second member 114. Furthermore, the reducer 128 of the electrically driving means 112 is designed to decelerate and output the rotation of the motor 127 in multi-stages. For example, as shown in FIG. 14, the reducer 128 comprises a plurality of planetary gear units 150 which are arranged along the rotation center CL, each of the planetary gear units 150 comprising a carrier 148 for rotatably supporting thereon three planetary gears 147 engaging a sun gear 145 and internal teeth gear 146.

The body block 136 comprises a spacer block 151, a first clutch block 152, a second clutch block 153 and an operating button housing block 154 which are arranged from the left in FIG. 12.

Figure 15:
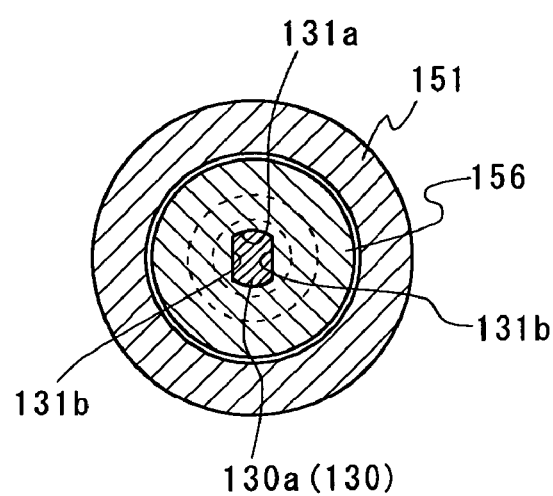
FIG. 15 is a sectional view of the third preferred embodiment of an electrically opening and closing mechanism according to the present invention, which is taken along line XV—XV of FIG. 12.

The spacer block 151 is cylindrical, and is housed in the hole 144, which is formed in the protruding portion 124 of the first member 113, to be fixed to the first member 113 so as to butt against the tip face 155 of the cylindrical casing 137. The spacer block 151 houses therein one end portion of the connecting shaft 131, which is fitted into the output shaft 130 of the reducer 128 so as to be rotatable therewith, and the first spring 134 for always biasing a flange-shaped spring bearing portion 156 which is formed in one end portion of the connecting shaft 131. FIG. 15 shows the engagement of the output shaft 130 of the reducer 128 with the connecting shaft 131. As shown in this figure, a width across flat portion 130a on the tip side of the output shaft 130 engages an engaging hole 131a of the connecting shaft 131 so as to be slidable and so as not to be relatively rotatable. As shown in FIGS. 12 and 15, the engaging hole 131a of the connecting shaft 131 has a shape corresponding to a cross section of the width across flat portion 130a of the output shaft 130, so that the width across flat face 131b of the engaging hole 131a tightly engages the width across flat portion 130a of the output shaft 130 to allow the rotation of the connecting shaft 131 with the output shaft 130. The depth of the engaging hole 131a of the connecting shaft 131 is so set as to prevent the tip of the output shaft 130 from butting against the bottom of the engaging hole 131a in view of assembly errors between the first friction member 132 and the first clutch block 152.

The first clutch block 152 is housed in a hole 157 formed in the protruding portion 118 of the second member 114, and one end (the left end in FIG. 12) thereof is bonded and fixed to the second member 114 so as to butt against the right end portion of the spacer block 151 in the figure. The right face of the first clutch block 152 in FIG. 12 is formed with a recessed portion 158 for housing therein the substantially disk-shaped first friction member 132 which is fixed to the other end of the connecting shaft 131 (the right end in FIG. 12). The recessed portion 158 of the first clutch block 152 is formed with an inner peripheral tapered surface 161 which engages an outer peripheral tapered surface 160 of the first friction member 132. The inner peripheral tapered surface 161 of the first clutch block 152 and the outer peripheral tapered surface 160 of the first friction member 132 are formed so as to have the same tapered angle to form a surface contact therebetween. The outer peripheral tapered surface 160 of the first friction member 132 is always pushed onto the inner peripheral tapered surface 161 of the first clutch block 152 by the spring force of the first spring 134. As a result, the inner peripheral tapered surface 161 of the first clutch block 152 always frictionally engages the outer peripheral tapered surface 160 of the first friction member 132 by the spring force of the first spring 134, so that the first clutch block 152 is associated with the first friction member 132 for forming a first clutch K1.

Furthermore, the axial hole 162 of the first clutch block 152 is designed to engage the connecting shaft 131 via a sufficient gap. In view of the variation in precision of shape of the outer peripheral tapered surface 160 of the first friction member 132 and the inner peripheral tapered surface 161 of the first clutch block 152, a gap 163 extending along the rotation center CL is provided between the first friction member 132 and the first clutch block 152. The tapered angle of the outer peripheral tapered surface 160 of the first friction member 132 and the inner peripheral surface 161 of the first clutch block 152 is set to be about 3 to 5 degrees so that a sufficient frictional force is caused on the contact portion between both of the tapered surfaces. However, the tapered angle of the outer peripheral tapered surface 160 of the first friction member 132 and the inner peripheral tapered surface 161 of the first clutch block 152 should not be limited to that in this preferred embodiment, but it may be suitably set to be the optimum angle in an angular range in which it is possible to produce a friction force necessary for the rotation of the second member 114 or first member 113.

The second clutch block 153 is arranged on the right of the first clutch block 152 in FIG. 12, and is housed in the hole 157, which is formed in the protruding portion 118 of the second member 114, to be bonded and fixed to the second member 114 so as to butt against the right end portion of the first clutch block 152 in FIG. 12. The second clutch block 152 has an axial hole 165, into which the rod portion 164 of the operating button 126 is fitted via a gap, in the central portion, and has a recessed portion 166 which is open to the first clutch block 152. The recessed portion 166 of the second clutch block 153 houses therein the second friction member 133 which is fixed to the tip of the rod portion 164 of the operating button 126. In the inner face 167 of the recessed portion 166 of the second clutch block 153, a pair of grooves 170 engageable with protrusions 168 of the second friction member 133 are formed so as to extend in radial directions (see FIGS. 16A and 16B). The second friction member 133 and the second clutch block 153 are associated with each other for forming a second clutch K2. Furthermore, the second clutch block 153 has such a size that the second friction member 133 does not contact the first clutch block 152 and first friction member 132 even if the operating button 126 is pushed into the operating button housing block 154 to the maximum.

Figure 16A:
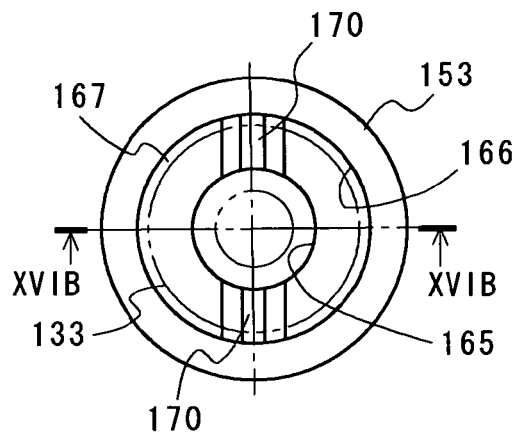
FIG. 16A is a front view of a second clutch block.
Figure 16B:
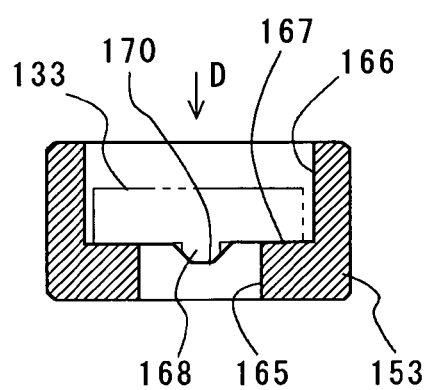
FIG. 16B is a sectional view taken along line XVIB—XVIB of FIG. 16A.
Figure 17:
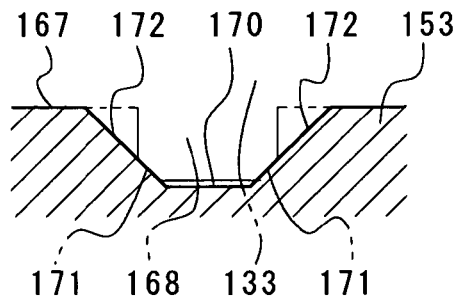
FIG. 17 is an illustration for explaining a state that the groove of the second clutch block of FIG. 16 engages the protrusion of a second friction member.

FIGS. 16A and 16B show the details of the second clutch block 153. FIG. 16A is a front view of the second clutch block 153, which shows the second friction member 133 by two-dot chain lines, and FIG. 16B is a sectional view taken along line XVIB—XVIB of FIG. 16A. FIG. 17 is an enlarged view showing a state that the protrusions 168 of the second friction member 133 engage the grooves 170 of the second clutch block 153. As shown in these figures, the groove 170 of the recessed portion 166 of the second clutch block 153 has a reversed equal-leg trapezoidal cross section taken along a line perpendicular to radial directions (as shown in FIGS. 16A and 17) so that the protrusions 168 of the second friction member 133 biased by the second spring 135 can engage the grooves 170 although the protrusions 168 can easily disengage from the grooves 170. That is, if force is applied so as to relatively rotate the second friction member 133 and second clutch block 153, chamfers 171 formed on the tips of the protrusions 168 of the second friction member 133 smoothly slide on the inclined surfaces 172 of the grooves 170. Furthermore, the shape of the protrusions 168 and grooves 170 should not be limited to that in this preferred embodiment, but the cross section thereof may be a substantially triangular cross section or a circular cross section.

The operating button housing block 154 is housed in a hole 173 formed in the first member 113, and the outer periphery thereof is fixed to the first member 113 by adhesion or the like so that the left end portion thereof butts against the right end portion of the second clutch block 153 in FIG. 12. The operating button housing block 154 has a recessed portion 174 for housing therein the operating button 126, and an axial hole 175 for allowing the rod portion 164 of the operating button 126 to pass toward the second clutch block 153. The recessed portion 174 of the operating button housing block 154 can slidably house therein the cylindrical head portion 176 of the operating button 126. The second spring 135 is designed to be housed in a space between the bottom face (the right side face of the side wall 177 in FIG. 12) of the recessed portion 174 and the head portion 176 on the side of the outer periphery of the rod portion 164 of the operating button 126.

Figure 18:
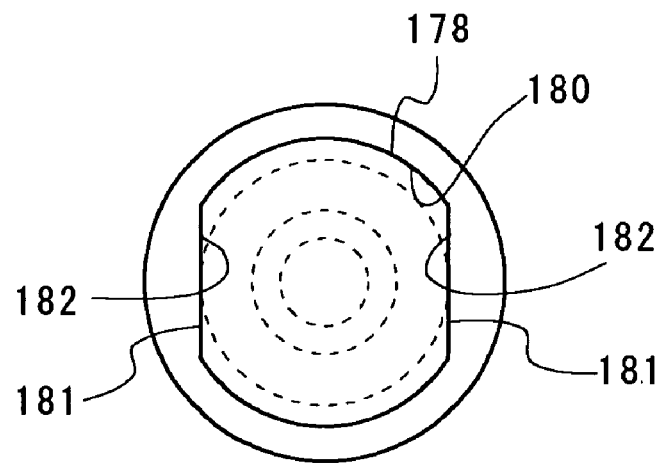
FIG. 18 is a front view showing a state that an operating button engages an operating button receiving block.

As shown in FIGS. 12 and 18, the open end portion of the recessed portion 174 of the operating button housing block 154 has a recess 180 which engages the flange portion 178 of the operating button 126. The recess 180 of the operating button housing block 154 has a pair of width across flat faces 182, 182 which tightly engage a pair of cut-out faces 181, 181 forming the width across flat portions of the flange portion 178, and serves as a detent for the operating button 126. The recess 180 serving as a detent is formed so as to be capable of ensuring a sufficient space, into which the operating button 126 is further pushed, even if the operating button 126 is pushed against the spring force of the second spring 135 to cause the protrusions 168 of the second friction member 133 to disengage from the grooves 170 of the second clutch block 153. On the bottom of the recess 180 of the operating button housing block 154, there is provided a switch 183 which is turned ON if it is depressed by the flange portion 178 of the operating button 126.

In the electrically opening and closing mechanism 11 with this construction, the electrically driving means 112 is first housed in the holes 142, 143 and 144 of the first and second members 113 and 114 so that the output shaft 130 is positioned on the right in FIG. 12, and then, the portions of the protruding portions 123 and 124 of the first member 113 engaging the holes 142 and 144 are bonded and fixed to the first member 113.

Then, the spacer block 151 is housed in the hole 144 of the protruding portion 124 of the first member 113 so as to butt against the tip face 155 of the cylindrical casing 137, and the spacer block 151 is bonded and fixed thereto. The connecting shaft 131 engaging the first spring 134 is previously inserted into the axial hole 162 of the first clutch block 152 to fix the first friction member 132 to the small-diameter portion 184 at the tip of the connecting shaft 131 protruding from the axial hole 162 to the right in FIG. 12, to mount the first friction member 132, connecting shaft 131 and first spring 134 on the first clutch block 152. Then, the connecting shaft 131 and first spring 134 mounted on the first clutch block 152 are housed in the internal cavity of the spacer block 151 to cause the engaging hole 131a, which is formed in the tip of the connecting shaft 131, to engage the width across flat portion 130a at the tip of the output shaft 130, and the connecting shaft 131 and first spring 134 are pushed into the spacer block 151 until the first clutch block 152 butts against the right end portion of the spacer block 151 in FIG. 12. Then, the outer peripheral portion of the first clutch block 152 is bonded and fixed to the protruding portion 124 of the first member 113 at the position at which the first clutch block 152 butts against the spacer block 151.

The operating button 126 and the second spring 135 are previously housed in the recessed portion 174 of the operating button housing block 154 to insert the rod portion 164 of the operating button 126, which protrudes from the side wall 177 of the operating button housing block 154, into the axial hole 165 of the second clutch block 153 to fix the second friction member 133 to the small-diameter portion 185 which is formed at the tip of the rod portion 164 protruding into the recessed portion 166 of the second clutch block 153. Thus, the operating button 126 is biased to the right in FIG. 12 by means of the second spring 135, and the second friction member 133 is pushed onto the inner face (the left face in FIG. 12) of the recessed portion 166 of the second clutch block 153 by the spring force of the second spring 135, so that the protrusions 168 of the second friction member 133 engage the grooves 170 of the second clutch block 153 due to the spring force of the second spring 135.

Such a unit comprising the operating button housing block 154, operating button 126, second spring 135, second clutch block 153 and second friction member 133 will be hereinafter referred to as an operating button/second clutch unit for convenience. The operating button/second clutch unit is inserted into the hole 173 of the protruding portion 125 of the first member 113 and the hole 157 of the protruding portion 118 of the second member 114 until the second clutch block 153 of the operating button/second clutch unit butts against the first clutch block 152. Then, at the position at which the second clutch block 153 of the operating button/second clutch unit butts against the first clutch block 152, the outer peripheral portion of the second clutch block 153 is bonded and fixed to the second member 114, and the operating button housing block 154 is bonded and fixed to the first member 113. Thus, the first member 113 and the second member 114 are connected to each other by means of the electrically opening and closing mechanism 111.

In the electrically opening and closing mechanism 11 with this construction, if one of the first member 113 and second member 114 is rotated with respect to the other by a user's hand (e.g., if the user opens the second member 114 is open with his one hand while holding the first member 113 in the other hand in that state that the second member 114 is folded on the first member 113), the first clutch K1 causes a slip (between the inner peripheral tapered surface 161 of the first clutch block 152 and the outer peripheral tapered surface 160 of the first friction member 132), and the protrusions 168 of the second friction member 133 are ejected from the grooves 170 of the second clutch block 153 against the spring force of the second spring 135, so that the second clutch K2 causes a slip (on the contact surface of the second friction member 133 with the second clutch block 153). Thus, the first member 113 and the second member 114 can also be manually rotated by the electrically opening and closing mechanism 111.

In the electrically opening and closing mechanism 111 in this preferred embodiment, the protrusions 168 of the second friction member 133 engage the grooves 170 of the second clutch block 153 by the spring force of the second spring 135 when the second member 114 is completely folded on the first member 113, and the protrusions 168 of the second friction member 133 engage the grooves 170 of the second clutch block 153 by the spring force of the second spring 135 when the first member 113 and the second member 114 are completely open. With this construction, when the first member 113 and the second member 114 are completely closed and open, a feeling that the protrusions 168 of the second friction member 133 engage the grooves 170 of the second clutch block 153 by the spring force of the second spring 135 is transmitted to the user's hand. As a result, according to the electrically opening and closing mechanism 111 in this preferred embodiment, the user can have a sense of security.

While the electrically opening and closing mechanism 111 in this preferred embodiment has had the grooves 170 formed in the second clutch block 153, and the protrusions 168 formed on the second friction member 133, protrusions may be formed on the second clutch block 153 and grooves engageable with the protrusions may be formed in the second friction member 133.

While the second clutch block 153 in the electrically opening and closing mechanism 111 in this preferred embodiment has been formed with the pair of grooves 170 on the same radial line so that the protrusions 168 of the second friction member 133 engage the grooves 170 if the second member 114 is rotated by 180 degrees from the state that the second member 114 is closed on the first member 113, the present invention should not be limited thereto. For example, a plurality of grooves 170 may be formed at appropriate angular intervals so that an angular range of 0 to 180 degrees is divided into a plurality of portions. Alternatively, the full open angle between the first member 113 and second member 114 may be set to be an appropriate angle other than 180 degrees in view of operation performance and ease to handle.

Figure 19:
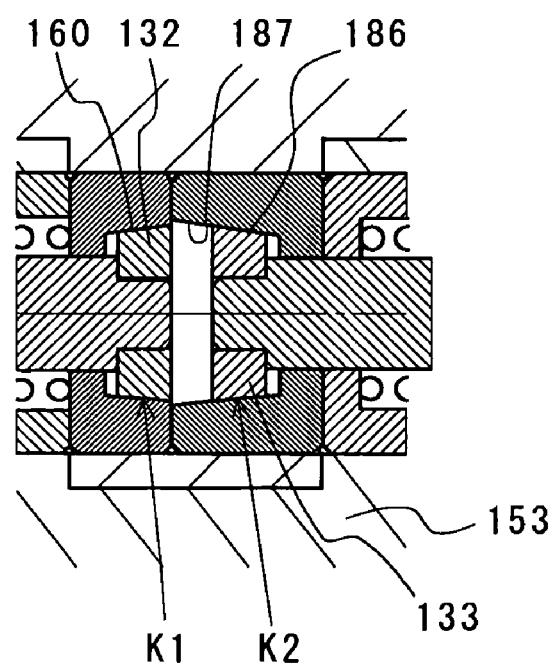
FIG. 19 is a sectional view of a modified example of the third preferred embodiment of an electrically opening and closing mechanism according to the present invention.

While the protrusions 168 formed on the second friction member 133 in the electrically opening and closing mechanism 111 in this preferred embodiment has engaged the grooves 170 formed in the second clutch block 153, the present invention should not be limited thereto. For example, the protrusions 168 of the second friction member 133 and the grooves 170 of the second clutch block 153 may be omitted to form a plane to cause the second friction member 133 to contact the inner face 167 of the second clutch block 153 as a surface contact. That is, the second friction member 133 may be a simple disk-shaped friction clutch plate. Thus, it is possible to simply eliminate the click feeling during operation to obtain a smooth relative rotation of the first member 113 to the second member 114. In addition, as shown in FIG. 19, a tapered surface 186 inclined in the opposite direction to the outer peripheral tapered surface 160 of the first friction member 132 may be formed on the side of the outer periphery of the second friction member 133, and a tapered surface 187 having the same inclined angle as that of the tapered surface 186 may be formed on the second clutch block 153, so that the tapered surface 186 may engage or disengage from the tapered surface 187 to engage or disengage the second clutch K2.

FIG. 13 shows a state that the second member 114 is electrically operated. That is, if the operating button 126 is thrust to the left in FIG. 12 against the spring force of the second spring 135, the protrusions 168 of the second friction member 133 are ejected from the grooves 170 of the second clutch block 153, so that the second clutch K2 is disengaged. If the operating button 126 is further pushed into the operating button housing block 154, the switch 183 provided on the bottom of the recess 180 is turned ON by the tip of the flange portion 178 to start energization to the motor 127 to start the rotation of the motor 127. The rotation of the motor 127 is sufficiently reduced by the reducer 128 to be transmitted to the first friction member 132 via the output shaft 130 and connecting shaft 131. At this time, the first friction member 132 is pushed onto the first clutch block 152 by the spring force of the first spring 134 to engage the first clutch K1. On the other hand, the second clutch K2 remains being disengaged as described above. Thus, the second member 114 is open and closed by the electrically driving means 112 via the first clutch K1.

If the operating button 126 is returned, the switch 183 leaves the flange portion 178 to interrupt energization to the motor 127 to allow the protrusions 168 of the second friction member 133 to be pushed onto the inner face 167 of the second clutch block 153 by the spring force of the second spring 135, so that the second clutch K2, along with the first clutch K1, is engaged. As a result, the stop attitude of the second member 114 is held by the frictional force of the first clutch K1 and the frictional force of the second clutch K2.

If the operating button 126 remains being pushed and if it is detected by a sensor (e.g., the first sensor 48 in FIG. 3) that the second member 114 is completely folded on the first member 113, energization to the motor 127 is interrupted, so that the closing operation of the second member 114 with respect to the first member 113 is completed. At this time, the protrusions 168 of the second friction member 133 engage the grooves 170 of the second clutch block 153 by the spring force of the second spring 135. On the other hand, if it is detected by a sensor (e.g., the second sensor 50 in FIG. 3) that the second member 114 is fully open with respect to the first member 113, energization to the motor 127 is interrupted, so that the opening operation of the second member 114 with respect to the first member 113 is completed. At this time, the protrusions 168 of the second friction member 133 engage the grooves 170 of the second clutch block 153 by the spring force of the second spring 135.

In the state (full closed state) that the second member 114 is completely folded on the first member 113, if the operating button 126 is pushed to cause the switch 183 to be turned ON by the flange portion 178 of the operating button 126, the motor 127 starts to operate, so that the second member 114 rotates about the rotation center CL to be open. On the other hand, in the state (full open state) that the second member 114 is fully open with respect to the first member 113, if the operating button 126 is pushed to cause the switch 183 to be turned ON by the flange portion 178 of the operating button 126, the motor 127 starts to operate, so that the second member 114 rotates about the rotation center CL to be closed.

According to the electrically opening and closing mechanism 111 in this preferred embodiment with the above described construction, the first clutch K1 is engaged by the spring force of the first spring 134 regardless of the operated state of the operating button 126, and the clutch (e.g., the first clutch K1) is not engaged by the depressing force applied to the operating button 126, so that the first member 113 and the second member 114 can be relatively rotated by the electrically driving means 112 if only the operating button 126 is thrust against the spring force of the second spring 135. Therefore, the operating force applied to the operating button 126 can be smaller than that in the electrically opening and closing mechanisms 1 and 61 in the above described first and second preferred embodiments, so that it is possible to improve operation performance during electrically opening and closing operations.

According to the electrically opening and closing mechanism 111 in this preferred embodiment, when the second member 114 is manually open, the second friction member 133 leaves the inner face 167 of the second clutch block 153 against the spring force of the second spring 135 to cause the protrusions 168 of the second friction member 133 to be ejected from the grooves 170 of the second clutch block 153, so that the first clutch K1 causes a slip while the second clutch K2 causes a slip (the second friction member 133 and the second clutch block 153 cause a slip). However, since a load applied to the electrically driving means 112 consists of the slip resistance of the first clutch K1 and the slip resistance of the second clutch K2, the electrically driving means 112 (the motor 127 and the reducer 128) are not damaged by the manual operation.

According to the electrically opening and closing mechanism 111 in this preferred embodiment, if only the operating button 126 is pushed, the second clutch K2 can be disengaged, and the electrically driving means 112 can be operated, so that the opening and closing operations of the second member 114 can be automatically carried out by the electrically driving means 112. In addition, according to the electrically opening and closing mechanism 111 in this preferred embodiment, the second member 114 can be automatically rotated to an optional angular position by operating the operating button 126, and the attitude of the second member 114 can be held at the optional angular position by the frictional force of the first clutch K1 and second clutch K2. As a result, according to the electrically opening and closing mechanism 111 in this preferred embodiment, the user can very easily open and close the second member 114 with his one hand.

According to the electrically opening and closing mechanism 111 in this preferred embodiment, if the second member 114 is completely folded on the first member 113 when it is manually open and closed, the protrusions 168 of the second friction member 133 engage the grooves 170 of the second clutch block 153 by the spring force of the second spring 135, and if the second member 114 is fully open with respect to the first member 113, the protrusions 168 of the second friction member 133 engage the grooves 170 of the second clutch block 153 by the spring force of the second spring force 135. Therefore, the user can have a feeling (a so-called click feeling), such as very small sound and/or very light shock, during the engagement of the protrusions 168 of the second friction member 133 with the grooves 170 of the second clutch block 153, so that the user can have a sense of security.

According to the electrically opening and closing mechanism 111 in this preferred embodiment, the power of the electrically driving means 112 is transmitted to the second member 114 by means of the first clutch K1 serving as a friction clutch during electrically opening and closing operations. Therefore, even if the second member 114 is manually operated by the user while the second member 114 is electrically open or closed, the first clutch K1 causes a slip, so that it is possible to prevent overload from being applied to the electrically driving means 112.

According to the electrically opening and closing mechanism 111 in this preferred embodiment, the first member 113 and the second member 114 are arranged concentrically with the rotation center, and a part thereof (a part of the cylindrical casing 137 in this preferred embodiment) serves as a shaft supporting portion for allowing the relative rotation of the first member 113 and second member 114, so that it is possible to miniaturize and lighten a machine to be mounted (e.g., a portable telephone or a portable information terminal).

Furthermore, in the electrically opening and closing mechanism 111 in this preferred embodiment, if the second member 114 can be rotatably supported on the cylindrical casing 137, the right and left in FIG. 12 may be reversed so that the user can operate the operating button 126 with his left hand. Thus, the electrically opening and closing mechanism 111 in this preferred embodiment may be formed as an electrically opening and closing mechanism 111 for a left-handed person.

The electrically opening and closing mechanism 111 in this preferred embodiment may be integrated as an electrically opening and closing mechanism unit by previously assembling components, and the electrically opening and closing mechanism unit may be mounted into the holes 142, 143, 144, 157 and 173 formed in the rotation central portion of the first and second members 113 and 114. When the electrically opening and closing mechanism 111 is assembled as a unit, if the assembled electrically opening and closing mechanism 111 is housed in a substantially cylindrical casing to be integrated, it is possible to facilitate carrying and storage. In addition, it is possible to prevent the mechanism from being damaged by shocks from the outside, and it is possible to prevent dust and foreign matters from entering the interior from the atmosphere.

While the first spring 134 and the second spring 135 in the electrically opening and closing mechanism 111 in this preferred embodiment have been coil springs as shown in FIGS. 12 and 13, the present invention should not be limited thereto, but other well-known spring means, such as coned disc springs, may be suitably used.

Other Preferred Embodiments

While the first member 3 has been assumed to be held in a user's right hand in the first preferred embodiment, the present invention should not be limited thereto, but the right and left sides of the electrically opening and closing mechanism 1 in FIG. 1 maybe reversed to be mounted so as to be laid across the first and second members 3 and 4, so that it is possible to improve operation performance (ease to handle) using one hand of a left-handed person.

While the first member 63 has been assumed to be held in a user's left hand in the second preferred embodiment, the present invention should not be limited thereto, but the right and left sides of the electrically opening and closing mechanism 61 in FIG. 9 maybe reversed to be mounted so as to be laid across the first and second members 63 and 64, so that it is possible to improve operation performance (ease to handle) using one hand of a right-handed person.

While the second member 4, 64 or 114 has been designed to be rotated in the electrically opening and closing mechanism 1, 61 or 111 in the first or second preferred embodiment, the present invention should not be limited thereto, but the first member 3, 63 or 113 may be designed to be rotated.

Figure 11:
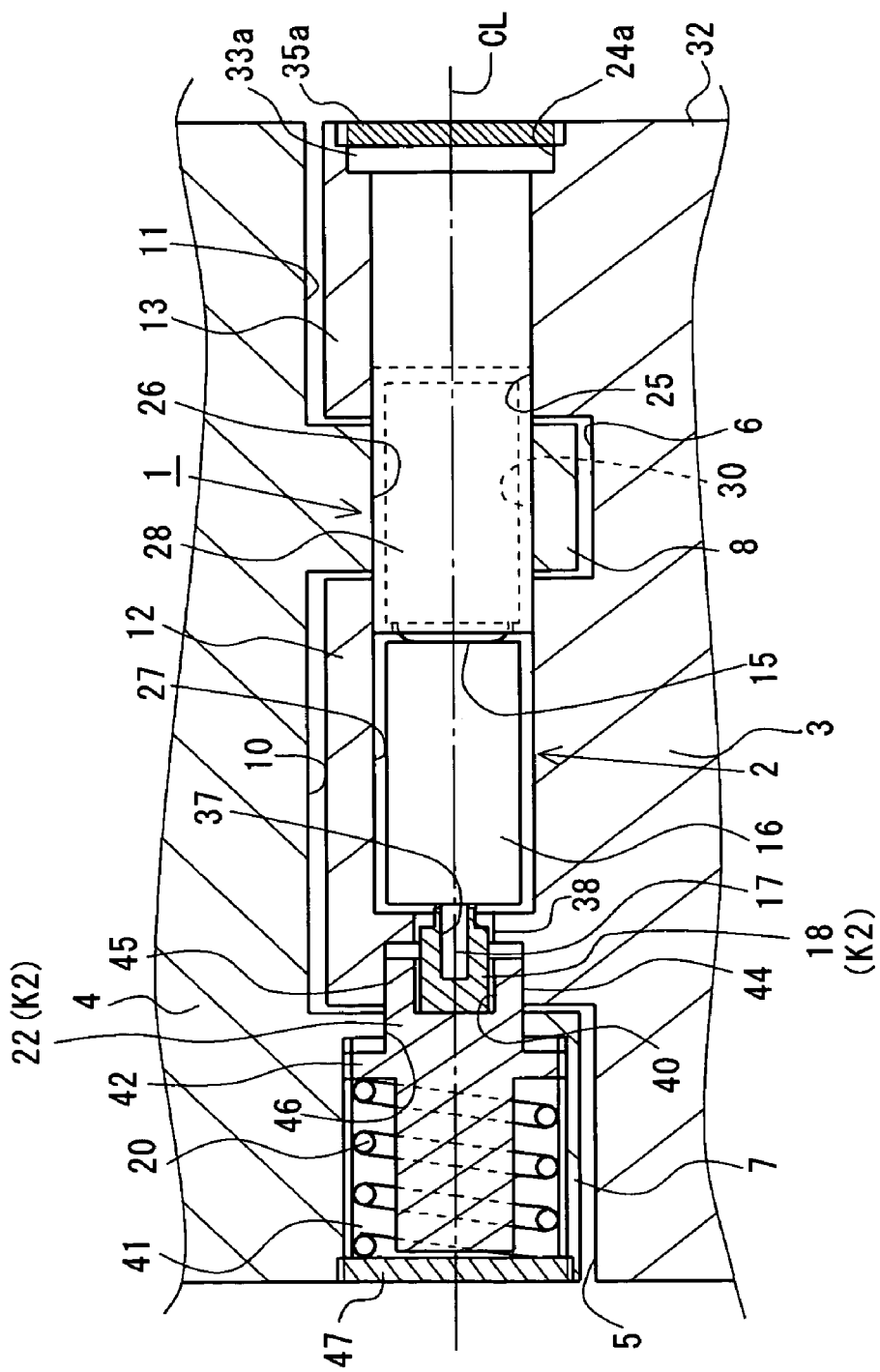
FIG. 11 is a sectional view of a modified example of the first preferred embodiment of an electrically opening and closing mechanism according to the present invention.

For example, the electrically opening and closing mechanism 1 in the first preferred embodiment may be modified as shown in FIG. 11. That is, in the electrically opening and closing mechanism 1 shown in FIG. 11, a flange portion 33a engages a hole 24a formed in the first member 3, and a lid member 35a is screwed on the opening portion of the hole 24a. In addition, the electrically driving means 2 is mounted on the first member 3 so as not to be slidable. Moreover, the first clutch K1 shown in FIGS. 1 and 2 is omitted, and the second clutch K2 is always engaged. By operating an operating button (not shown), the motor 15 is energized, so that the electrically driving means 2 is operated. Also with this construction, the second member 4 can be rotated to an optional angular position by the electrically driving means 2, and the attitude of the second member 4 can be held at the optional angular position, so that it is possible to improve one hand operation performance as compared with conventional mechanisms. When the second member 4 is manually open or closed, the second clutch K2 can slip by a manual operation. Furthermore, in FIG. 11, the same reference numbers are given to portions corresponding to those in the first preferred embodiment shown in FIGS. 1 and 2, and repeated explanations are omitted.

In the first through third preferred embodiments, at least friction contact portions of the first clutch K1 and second clutch K2 are preferably formed of a material having a high frictional resistance. In addition, on the friction contact surfaces of the first clutch K1 and second clutch K2, irregularities for increasing frictional resistance may be formed, or a material for increasing frictional resistance may be coated.

Moreover, the electrically opening and closing mechanisms 1, 61 and 111 in the first through third preferred embodiments can not only be utilized for opening and closing relatively rotatable two members (e.g., a body and a liquid crystal display panel) of a portable telephone or a portable information terminal, but they can be also widely used for opening and closing a lid.

As described above, according to the present invention, if only the operating part is pushed, the first clutch is disengaged while the second clutch is engaged, and the electrically driving means can be operated to automatically rotate any one of the first and second members. In addition, according to the present invention, if the operating part is operated, any one of the first and second members can be automatically rotated to an optional angular position, and the attitude of the first and second members can be held at the optional angular position. As a result, according to the present invention, the user can very easily open and close the first and second members with his one hand.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An electrically opening and closing mechanism comprising:
   electrically driving means for electrically rotating a first member which is rotatably mounted on a second member;
   a first clutch for allowing said first and second members to frictionally contact each other while allowing said first member to be manually rotated when said first clutch is engaged;
   a second clutch for allowing said first member to be rotated by said electrically driving means when said second clutch is engaged; and
   an operating part for disengaging said first clutch and engaging said second clutch when said operating part is pushed.

2. An electrically opening and closing mechanism as set forth in claim 1, wherein each of said first and second clutches is a friction clutch.

3. An electrically opening and closing mechanism as set forth in claim 1, wherein said first clutch, said second clutch, said operating part and said electrically driving means are arranged concentrically with a rotation center of said first and second members.

4. An electrically opening and closing mechanism as set forth in claim 1, wherein said operating part serves as a rotation supporting portion for rotatably supporting thereon said first and second members.

5. An electrically opening and closing mechanism as set forth in claim 1, wherein said first clutch comprises a pair of friction members, one of which is pressed against the other of said friction members by a spring, and
   said pair of friction members have a recess and a protrusion, respectively, said recess engaging said protrusion when said first member relatively rotates by a predetermined angle.

6. An electrically opening and closing mechanism as set forth in claim 1, which further comprises a sensor for detecting that said first member rotates to a predetermined angle, and wherein said electrically driving means is rotated in a reverse direction in response to a detection signal of said sensor.

* * * * *